(12) United States Patent
Chen et al.

(10) Patent No.: US 8,445,969 B2
(45) Date of Patent: May 21, 2013

(54) HIGH PRESSURE DEUTERIUM TREATMENT FOR SEMICONDUCTOR/HIGH-K INSULATOR INTERFACE

(75) Inventors: Xiangdong Chen, Poughquag, NY (US); Laegu Kang, Hopewell Junction, NY (US); Weipeng Li, Beacon, NY (US); Dae-Gyu Park, Poughquaq, NY (US); Melanie J. Sherony, Wappingers Falls, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 237 days.

(21) Appl. No.: 13/094,873

(22) Filed: Apr. 27, 2011

(65) Prior Publication Data

US 2012/0273894 A1 Nov. 1, 2012

(51) Int. Cl.
*H01L 27/092* (2006.01)
*H01L 21/8238* (2006.01)

(52) U.S. Cl.
USPC ............ 257/369; 257/E27.064; 257/E21.632; 257/E21.633; 438/199; 438/217

(58) Field of Classification Search
USPC ........... 257/369, E27.064, E21.633, E21.632; 438/199, 217
See application file for complete search history.

(56) References Cited

U.S. PATENT DOCUMENTS

| | | | |
|---|---|---|---|
| 6,815,317 B2 | 11/2004 | Schafbauer et al. | |
| 6,833,306 B2* | 12/2004 | Lyding et al. | 438/301 |
| 6,913,961 B2 | 7/2005 | Hwang | |
| 7,525,162 B2 | 4/2009 | Yin et al. | |
| 8,003,981 B2* | 8/2011 | Iwasaki et al. | 257/43 |
| 2002/0031920 A1* | 3/2002 | Lyding et al. | 438/795 |
| 2003/0219950 A1* | 11/2003 | Lyding et al. | 438/301 |
| 2009/0104741 A1* | 4/2009 | Shin et al. | 438/229 |
| 2009/0289280 A1 | 11/2009 | Zhang et al. | |
| 2009/0291540 A1 | 11/2009 | Zhang et al. | |

OTHER PUBLICATIONS

U.S. Appl. No. 12/859,664, filed Aug. 19, 2010, Methods of Forming CMOS Transistors Using Tensile Stress Layers and Hydrogen Plasma Treatment.
U.S. Appl. No. 12/687,374, filed Jan. 14, 2010, Balancing NFET and PFET Performance Using Straining Layers.

* cited by examiner

*Primary Examiner* — Victor A Mandala
(74) *Attorney, Agent, or Firm* — Hamilton & Terrile, LLP; Michael Rocco Cannatti

(57) ABSTRACT

An integrated circuit structure comprises at least one pair of complementary transistors on a substrate. The pair of complementary transistors includes a first transistor and a second transistor. In addition, only one stress-producing layer is on the first transistor and the second transistor and applies tensile strain force on the first transistor and the second transistor. The first transistor has a first channel region, a gate insulator on the first channel region, and a deuterium region between the first channel region and the gate insulator. The second transistor has a germanium doped channel region, as well as the same gate insulator on the germanium doped channel region, and the same deuterium region between the germanium doped channel region and the gate insulator.

24 Claims, 3 Drawing Sheets

HIGH PRESSURE DEUTERIUM TREATMENT FOR SEMICONDUCTOR/HIGH-K INSULATOR INTERFACE

BACKGROUND OF THE INVENTION

1. Field of the Invention

The embodiments presented herein generally relate to integrated circuit structures and more particularly, to methods and structures that utilize high pressure deuterium treatment to improve the interface quality of silicon germanium high-K insulators.

2. Description of Related Art

As integrated circuit structures such as transistors evolve, it has been discovered that placing physical strain (compression or tensile stress) upon the channel region of field effect transistors (FETs) can improve the performance of some types of transistors. Such stress producing or straining layers generally change their size as they cool, which produces the physical strain on the transistors.

Further advances in transistor technologies have developed dual stress liner applications where one type of transistor is covered where one type of strain producing layer and a complimentary type of transistor is covered with a different type of straining layer. For complete discussion of such dual stress liner features, see U.S. Pat. No. 7,525,162, incorporated herein by reference.

BRIEF SUMMARY OF THE INVENTION

An issue relating to transistor operation involves the use of high-K dielectrics, which may encounter channel interface quality problems when a tensile strain producing liner is utilized. While the tensile strain producing layer may not substantially affect NFETs (because such transistors can be readily formed with silicon channel regions); the silicon germanium channel regions of PFETs are not well suited for use with tensile stressing layers. However, with the deuterium regions utilized by embodiments herein, the channel/high-K dielectric interface quality problems of PFETs are substantially reduced or eliminated. Thus, with embodiments herein, only a single tensile stress producing liner can be utilized over both the NFETs and PFETs. Because only one liner needs to be formed, the embodiments herein simplify the structure and reduce the number of processing steps required to form the structure.

Various method and structure embodiments are disclosed herein. One embodiment comprises an integrated circuit structure comprising at least one pair of complementary transistors on a substrate. The pair of complementary transistors includes a first transistor and a second transistor. In addition, only one stress-producing layer is on the first transistor and the second transistor and applies tensile strain force on the first transistor and the second transistor. The first transistor has a first channel region, a gate insulator on the first channel region, and a deuterium region between the first channel region and the gate insulator. The second transistor has a germanium doped channel region, as well as the same gate insulator on the germanium doped channel region, and the same deuterium region between the germanium doped channel region and the gate insulator.

Another embodiment comprises an integrated circuit structure comprising at least one pair of complementary transistors on a substrate. The pair of complementary transistors includes a first transistor and a second transistor. In addition, only one stress-producing layer is on the first transistor and the second transistor and applies tensile strain force on the first transistor and the second transistor. The first transistor has a first channel region, a gate insulator on the first channel region, and a deuterium region between the first channel region and the gate insulator. The first channel region comprises gallium arsenide or indium gallium arsenide. The second transistor has a germanium doped channel region, as well as the same gate insulator on the germanium doped channel region, and the same deuterium region between the germanium doped channel region and the gate insulator.

A method of manufacturing an integrated circuit structure according to embodiments herein forms complementary channel regions separated by isolation regions within a substrate. The complementary channel regions comprise a first channel region of a first transistor, and the channel regions further comprise a germanium doped channel region of a second transistor. This exemplary method simultaneously patterns gate insulators on the complementary channel regions and subsequently simultaneously patterns gate conductors on the gate insulators. This method heats the substrate in a pressurized vessel containing deuterium to simultaneously form deuterium regions between the complementary channel regions and the gate insulators. This method also simultaneously forms only one stress-producing layer on the first transistor and the second transistor. The stress-producing layer applies tensile strain force on the first transistor and the second transistor.

Another method of manufacturing an integrated circuit structure according to embodiments herein forms complementary channel regions separated by isolation regions within a substrate. The complementary channel regions comprise a first channel region of a first transistor. The first channel region comprises one of gallium arsenide and indium gallium arsenide. The channel regions further comprise a germanium doped channel region of a second transistor. This exemplary method simultaneously patterns gate insulators on the complementary channel regions and subsequently simultaneously patterns gate conductors on the gate insulators. This method heats the substrate in a pressurized vessel containing deuterium to simultaneously form deuterium regions between the complementary channel regions and the gate insulators. This method also simultaneously forms only one stress-producing layer on the first transistor and the second transistor. The stress-producing layer applies tensile strain force on the first transistor and the second transistor.

DETAILED DESCRIPTION OF THE INVENTION

As mentioned above, many new forms of strain producing liners (such as dual stress liners) are being utilized with modern integrated circuit devices. However, for low power applications, stress liners can create gate induced drain leakage (GIDL) problems in the channel/gate insulator interface regions of the PFETs that use SiGe channels and a tensil liner. In view of these issues, the embodiments herein utilize high pressure deuterium treatment to improve the interface quality of silicon germanium high-K insulators in PFETs that use tensil stress liners.

Figure 1:
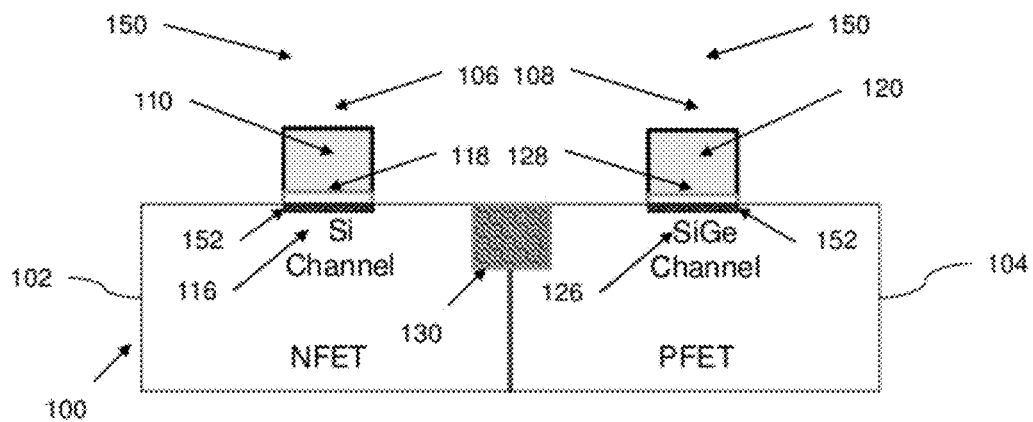
FIG. 1 is a schematic cross-sectional diagram of an integrated circuit structure according to embodiments herein.
Figure 2:
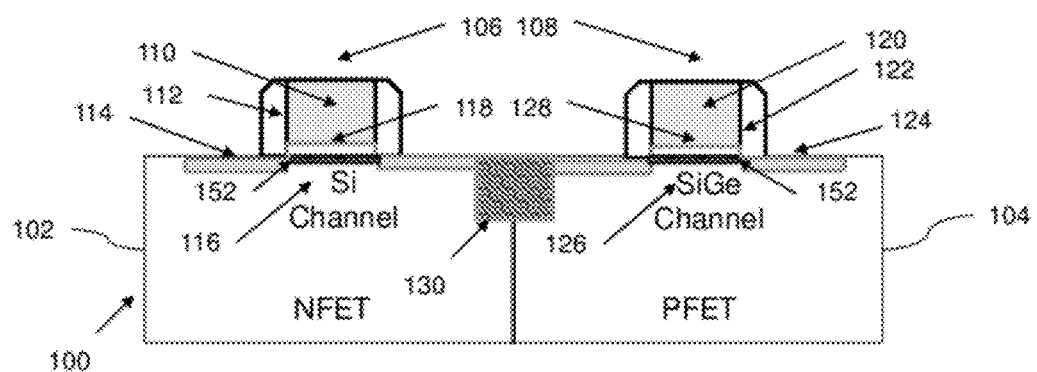
FIG. 2 is a schematic cross-sectional diagram of an integrated circuit structure according to embodiments herein.
Figure 3:
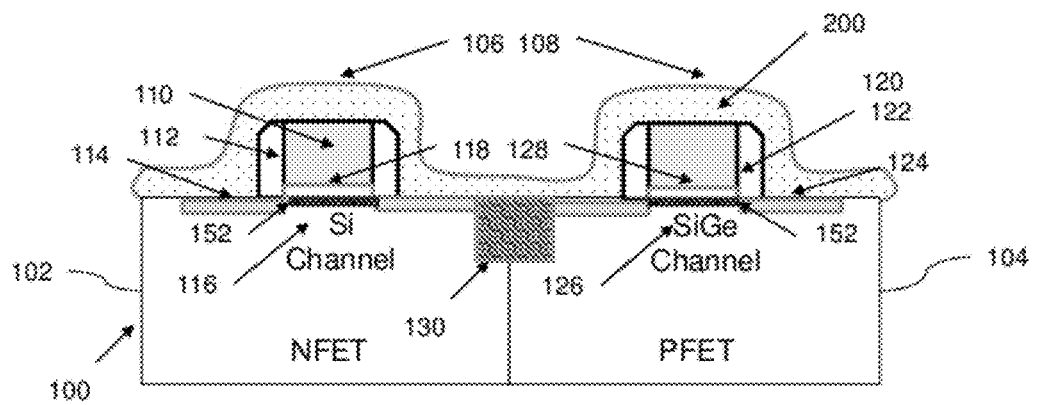
FIG. 3 is a schematic cross-sectional diagram of an integrated circuit structure according to embodiments herein.

More specifically, one example of the embodiments herein is shown in FIGS. 1-3. In FIGS. 1-3 illustrate the formation of an integrated circuit structure that includes a substrate 100. The substrate 100 includes different regions including negative-type (N-type) field effect transistor (NFET) regions 102 and positive-type (P-type) field effect transistor (PFET) regions 104.

This embodiment includes at least one pair of complementary metal oxide (CMOS) transistors on or in the substrate 100. The pair of complementary transistors comprises a first transistor 106 and a second transistor 108. The first transistor 106 in this example comprises a negative-type (N-type) transistor and the second transistor 108 comprises a positive-type (P-type) transistor.

Generally, such transistor structures are formed by depositing or implanting impurities into a substrate 100 to form at least one semiconductor channel region 116, 126 bordered (separated) by shallow trench isolation regions 130 below the upper surface of the substrate 100, as shown in FIG. 1. The second transistor 108 comprises a silicon germanium channel 126, while the first transistor comprises a silicon channel free of germanium 116.

The substrate 100 can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. The impurities can comprises any positive-type impurity (P-type impurity, e.g., phosphorus (P), arsenic (As), antimony (Sb) etc.) or any negative-type impurity (N-type impurity, e.g., boron, indium, etc.). The different channel regions 116, 126 are doped differently depending upon whether the transistor will be a positive-type or a negative-type transistor. As illustrated in FIG. 2, the transistors 106, 108 are complimentary to each other and are therefore opposite type polarity transistors.

The implantation processes mentioned herein can take any appropriate form (whether now known or developed in the future) and can comprise, for example, ion implantation, etc. Also see U.S. Pat. No. 6,815,317 (incorporated herein by reference) for a full discussion of implantation techniques. Shallow trench isolation (STI) structures are well-known to those ordinarily skilled in the art and are generally formed by patterning openings within the substrate and growing or filling the openings with a highly insulating material.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

The method forms a gate dielectric 118, 128 on the upper surface of the substrate 100 over the semiconductor channel region 116, 126 and patterns a gate conductor 110, 120 on the gate dielectric 118, 128 over the semiconductor channel region 116, 126 as shown in FIG. 1. The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

An issue relating to transistor operation involves the use of such high-K dielectrics, which may encounter channel interface quality problems when a tensile strain producing liner is utilized. While the tensile strain producing layer may not substantially affect NFETs (because such transistors can be readily formed with silicon channel regions); the silicon germanium channel regions of PFETs are not well suited for use with tensile stressing layers. However, with the deuterium regions 152 utilized by embodiments herein, the channel/high-K dielectric interface quality problems of PFETs are substantially reduced or eliminated. Thus, with embodiments herein, only a single tensile stress producing liner can be utilized over both the NFETs and PFETs. Because only one liner needs to be formed, the embodiments herein simplify the structure and reduce the number of processing steps required to form the structure.

More specifically, in order to improve the interface quality of silicon germanium and indium gallium arsenic gate conductors/high-K insulators, the present embodiments use a high pressure (20 atmospheres, 25 atmospheres, 30 atmospheres, and higher) deuterium annealing process (D2) to create regions 152 where deuterium is present. The high-pressure deuterium anneal is performed at any appropriate temperature, for any appropriate time period, and as many number of times is needed for a specific design. For example, the high-pressure deuterium anneal could be performed at 375° C.-425° C. for 1200 seconds-2400 seconds one time to ten times. Thus, as shown in FIG. 1, the embodiments herein perform one or more high pressure deuterium anneals 150.

As shown in FIG. 2, the method forms sidewall spacers 112, 122 on the sidewalls of the gate conductor 110, 120. Sidewall spacers are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Using the sidewall spacers 112, 122 as an alignment feature, any of the impurities mentioned above are implanted into the substrate to form the source and drain regions 114, 124. Again, the different transistors 106, 108 will utilizes different polarity dopants depending upon the polarity of the transistor for the source and drain regions.

The exposed portions of the silicon are then silicided by depositing a metal (such as, tungsten, hafnium, tantalum, molybdenum, titanium, nickel, etc.) and then heating the structure in a thermal annealing process. This produces silicides on the source and drain regions 114, 124 and silicides on the gate conductors 110, 120.

Thus, the CMOS transistor structures shown in FIG. 2, comprise at least one first-type field effect transistor 106 and at least one second-type field effect transistor 108. The first-type field effect transistor 106 and the second-type field effect transistor 108 each comprise source and drain regions 114, 124, channel regions 116, 126 between the source and drain regions 114, 124, a gate conductor 110, 120 adjacent the channel regions 116, 126, a gate insulator 118, 128 between the channel regions 116, 126 and the gate conductor 110, 120, a deuterium region 152 between the channel regions 116, 126 and the gate insulator 118, 128, and a silicide layer on the gate conductor 110, 120 and the source and drain regions 114, 124.

While only one of each type of transistor is illustrated in FIG. 2, those ordinarily skilled in the art would understand that many of each type of transistor could be formed on the substrate 100 and the drawings are intended to show multiple ones of each of the different types of transistors; however, the drawings have been simplified to only show a single transistor of each type for clarity and to allow the reader to more easily recognize the different features illustrated. This is not intended to limit the invention because, as would be understood by those ordinarily skilled in the art, the invention is applicable to structures that include many of each type of transistor.

Figure 4:
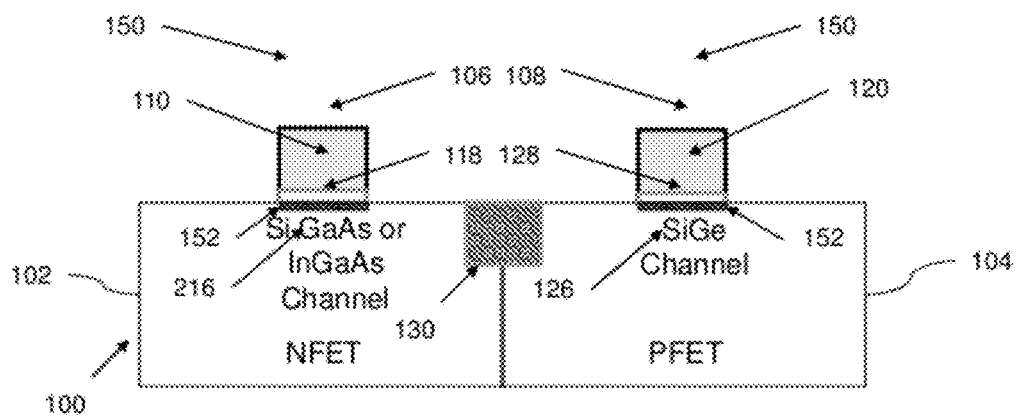
FIG. 4 is a schematic cross-sectional diagram of an integrated circuit structure according to embodiments herein.
Figure 5:
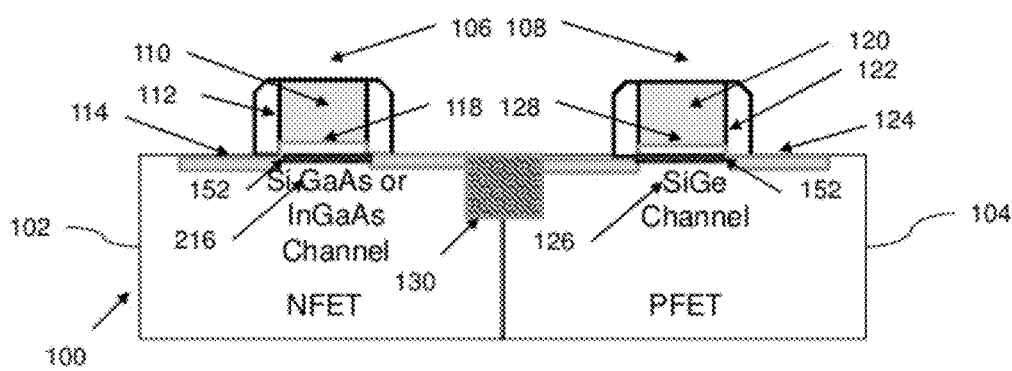
FIG. 5 is a schematic top-view diagram of a wafer according to embodiments herein.
Figure 6:
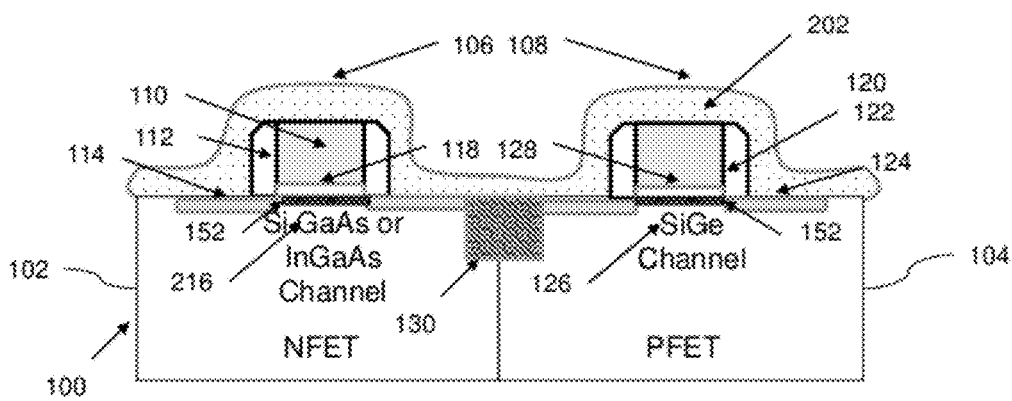
FIG. 6 is a schematic top-view diagram of a wafer according to embodiments herein.

As shown in FIG. 3, a stressing layer 200 is formed (deposited or grown) over the structure and cured. When the stressing layer 200 cures, its size changes, which produces tensile stress within the channel regions 116, 126, to increase the performance of the channel regions 116, 126. The stressing layer 200 is positioned over both the first transistor 106 and the second transistor 108 and is the only stressing layer used with embodiments herein. The same stress-producing layer 200 comprises, for example, deposited or grown silicon-nitride. The embodiments shown in FIGS. 4-6 are somewhat similar to those shown in FIGS. 1-3; however, the embodiments shown in FIGS. 4-6 utilize in GaAs (indium gallium arsenide) or GaAs (gallium arsenide) dopants within the channel regions 216 of NFET transistors 106. Additionally, a different stress-producing layer 202 which may be the same or different than layer 200 is utilized that can apply tensile strain force or neutral force (no stressing force) on the first transistor 106 and the second transistor 108. Again, the layer 202 is the only stressing layer used with these embodiments.

Figure 7:
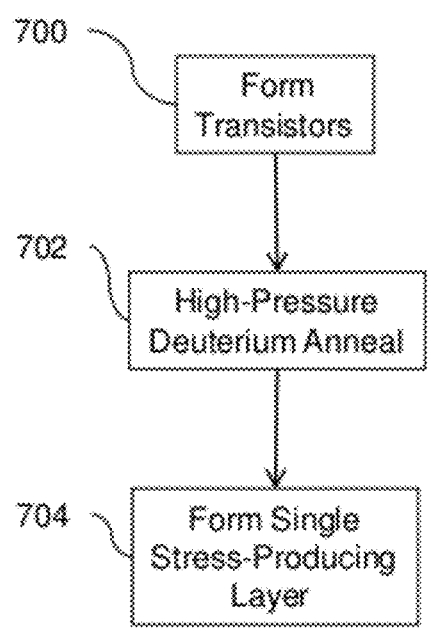
FIG. 7 is a flow diagram illustrating one exemplary method embodiment herein.

As shown in flowchart form in FIG. 7, the processing begins in item 700 where the transistors are formed in and/or on the substrate up to the formation of the gate conductors. In item 702, the high pressure deuterium is performed; and in item 704, the single stress-producing layer is formed.

Therefore, the present embodiments overcome the problems of conventional structures by utilizing a high-pressure deuterium anneal in combination with a single straining layer that improve the performance of transistors without causing gate induced drain leakage problems.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

The invention claimed is:

1. An integrated circuit structure comprising:
a substrate;
at least one pair of complementary transistors on said substrate, said pair of complementary transistors comprising a first transistor and a second transistor; and
only one stress-producing layer on said first transistor and said second transistor applying tensile strain force on said first transistor and said second transistor;
said first transistor comprising a first channel region, a gate insulator on said first channel region, and a deuterium region between said first channel region and said gate insulator, and
said second transistor comprising a germanium doped channel region, said gate insulator on said germanium doped channel region, and said deuterium region between said germanium doped channel region and said gate insulator.

2. The integrated circuit structure according to claim 1, said pair of complementary transistors comprising complementary metal oxide (CMOS) transistors.

3. The integrated circuit structure according to claim 1, said first transistor comprising a negative-type (N-type) transistor and said second transistor comprising a positive-type (P-type) transistor.

4. The integrated circuit structure according to claim 1, said second transistor comprising a silicon germanium channel and said first transistor comprising a silicon channel free of germanium.

5. The integrated circuit structure according to claim 1, said stress-producing layer comprising silicon-nitride.

6. The integrated circuit structure according to claim 1, said stress-producing layer comprising the same material on said first transistor and said second transistor.

7. An integrated circuit structure comprising:
a substrate;

at least one pair of complementary transistors on said substrate, said pair of complementary transistors comprising a first transistor and a second transistor; and only one stress-producing layer on said first transistor and said second transistor applying tensile strain force on said first transistor and said second transistor;

said first transistor comprising a first channel region, a gate insulator on said first channel region, and a deuterium region between said first channel region and said gate insulator, said first channel region comprising one of gallium arsenide and indium gallium arsenide, and said second transistor comprising a germanium doped channel region, said gate insulator on said germanium doped channel region, and said deuterium region between said germanium doped channel region and said gate insulator.

8. The integrated circuit structure according to claim 7, said pair of complementary transistors comprising complementary metal oxide (CMOS) transistors.

9. The integrated circuit structure according to claim 7, said first transistor comprising a negative-type (N-type) transistor and said second transistor comprising a positive-type (P-type) transistor.

10. The integrated circuit structure according to claim 7, said second transistor comprising a silicon germanium channel.

11. The integrated circuit structure according to claim 7, said stress-producing layer comprising silicon-nitride.

12. The integrated circuit structure according to claim 7, said stress-producing layer comprising the same material on said first transistor and said second transistor.

13. A method of manufacturing an integrated circuit structure, said method comprising:
   forming complementary channel regions separated by isolation regions within a substrate, said complementary channel regions comprising a first channel region of a first transistor, and said channel regions further comprising a germanium doped channel region of a second transistor;
   simultaneously patterning gate insulators on said complementary channel regions;
   simultaneously patterning gate conductors on said gate insulators;
   heating said substrate in a pressurized vessel containing deuterium to simultaneously form deuterium regions between said complementary channel regions and said gate insulators; and
   simultaneously forming only one stress-producing layer on said first transistor and said second transistor, said stress-producing layer applying tensile strain force on said first transistor and said second transistor.

14. The method according to claim 13, said first transistor comprising a negative-type (N-type) transistor and said second transistor comprising a positive-type (P-type) transistor.

15. The method according to claim 13, said second transistor comprising a silicon germanium channel and said first transistor comprising a silicon channel free of germanium.

16. The method according to claim 13, said heating being performed at a pressure of at least 20 atmospheres.

17. The method according to claim 13, said forming of said stress-producing layer comprising forming a layer of silicon-nitride.

18. The method according to claim 13, said stress-producing layer comprising the same material on said first transistor and said second transistor.

19. A method of manufacturing an integrated circuit structure, said method comprising:
   forming complementary channel regions separated by isolation regions within a substrate, said complementary channel regions comprising a first channel region of a first transistor, said first channel region comprising one of gallium arsenide and indium gallium arsenide, and said channel regions further comprising a germanium doped channel region of a second transistor;
   simultaneously patterning gate insulators on said complementary channel regions;
   simultaneously patterning gate conductors on said gate insulators;
   heating said substrate in a pressurized vessel containing deuterium to simultaneously form deuterium regions between said complementary channel regions and said gate insulators; and
   simultaneously forming only one stress-producing layer on said first transistor and said second transistor, said stress-producing layer applying tensile strain force on said first transistor and said second transistor.

20. The method according to claim 19, said first transistor comprising a negative-type (N-type) transistor and said second transistor comprising a positive-type (P-type) transistor.

21. The method according to claim 19, said second transistor comprising a silicon germanium channel and said first transistor comprising a silicon channel free of germanium.

22. The method according to claim 19, said heating being performed at a pressure of at least 20 atmospheres.

23. The method according to claim 19, said forming of said stress-producing layer comprising forming a layer of silicon-nitride.

24. The method according to claim 19, said stress-producing layer comprising the same material on said first transistor and said second transistor.

* * * * *